United States Patent
Kaneko

(10) Patent No.: US 9,029,768 B2
(45) Date of Patent: May 12, 2015

(54) DETECTOR AND CHARGED PARTICLE BEAM INSTRUMENT

(71) Applicant: JEOL Ltd., Tokyo (JP)

(72) Inventor: Takeshi Kaneko, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/307,551

(22) Filed: Jun. 18, 2014

(65) Prior Publication Data

US 2014/0374594 A1 Dec. 25, 2014

(30) Foreign Application Priority Data

Jun. 19, 2013 (JP) .................................. 2013-128576

(51) Int. Cl.
*G01N 23/00* (2006.01)
*G21K 7/00* (2006.01)
*G01T 1/20* (2006.01)

(52) U.S. Cl.
CPC .................................. *G01T 1/2008* (2013.01)

(58) Field of Classification Search
CPC ........................................................ G01T 1/20
USPC ............ 250/305, 307, 310, 311, 363, 370.11, 250/361 R
See application file for complete search history.

(56) References Cited

U.S. PATENT DOCUMENTS 7,612,342 B1 * 11/2009 Nagarkar ...................... 250/362

FOREIGN PATENT DOCUMENTS

JP 201326152 A 2/2013

OTHER PUBLICATIONS

Faruqi,A.R. and Tyrell, G.C., "Evaluation of gadolinium oxy-sulphide (P43) phosphor used in CCD detectors for electron microscopy". Ultramicroscopy, 76, (Feb. 1999) pp. 69-75.*

* cited by examiner

*Primary Examiner* — David Porta
*Assistant Examiner* — Meenakshi Sahu
(74) *Attorney, Agent, or Firm* — The Webb Law Firm

(57) ABSTRACT

A detector (100) is used to detect a charged particle beam (EB), and includes a first light emission portion (10) for converting the charged particle beam into light, a second light emission portion (20) for converting the charged particle beam transmitted through the first light emission portion (10) into light, and a light detector (30) for detecting the light produced by the first light emission portion (10) and the light produced by the second light emission portion (20). The first light emission portion (10) is a powdered scintillator. The second light emission portion (20) is a single crystal scintillator.

5 Claims, 6 Drawing Sheets

DETECTOR AND CHARGED PARTICLE BEAM INSTRUMENT

BACKGROUND OF THE INVENTION

1. Field of the Invention

The present invention relates to a detector and charged particle beam instrument.

2. Description of Related Art

Scintillators which emit light when irradiated with an electron beam are used in dark- field detectors and secondary electron detectors which are used respectively in scanning transmission electron microscopy (STEM) and scanning electron microscopy (SEM).

For example, JP-A-2013-26152 discloses an electron detector which is fitted with a ceramic scintillator including a ceramic phosphor prepared by sintering P47 ($Y_2SiO_5$:Ce) and which is for use in electron microscopy.

A scintillator made of a different material or shaped differently is used in a different detector application. Known examples of such scintillators include single crystal scintillators and powdered scintillators.

For example, where a single crystal scintillator is used and an electron beam is accelerated by an accelerating voltage, as the accelerating voltage is increased, the brightness of the scintillator increases. Therefore, an electron detector using a single crystal scintillator provides high detection sensitivity under high accelerating voltages. However, the detection sensitivity decreases with reducing the accelerating voltage.

Furthermore, a powdered scintillator shows a brightness peak under a certain accelerating voltage although this phenomenon is affected by the thickness of the scintillator, for the following reason. As the accelerating voltage decreases, the electron beam transmits through the scintillator less easily. This in turn deteriorates the brightness. As the accelerating voltage is increased, a greater portion of the beam transmits through the scintillator, leading to a decrease in the brightness. The value of the accelerating voltage at which the peak occurs varies with thickness of the powdered scintillator. An electron detector using a powdered scintillator shows a high detection sensitivity at the accelerating voltage where the peak occurs. The detection sensitivity decreases in going away from the accelerating voltage at which the accelerating voltage shows a peak.

In this way, the above-described electron detector has the problem that its detection sensitivity is not high over a wide range of accelerating voltages from a low voltage to a high voltage.

SUMMARY OF THE INVENTION

One object associated with some aspects of the present invention is to provide a detector providing high sensitivity over a wide range of accelerating voltages from a low accelerating voltage to a high accelerating voltage. Another object associated with some aspects of the invention is to provide a charged particle beam instrument including this detector.

(1) A detector associated with the present invention is adapted to detect a charged particle beam. The detector includes: a first light emission portion for converting the charged particle beam into light; a second light emission portion for converting the charged particle beam transmitted through the first light emission portion into light; and a light detector for detecting the light produced by the first light emission portion and the light produced by the second light emission portion. The first light emission portion is a powdered scintillator. The second light emission portion is a single crystal scintillator.

In this detector, the first light emission portion is a powdered scintillator and the second light emission portion is a single crystal scintillator. Therefore, the luminance of light produced by converting the charged particle beam can be enhanced over a wide range of accelerating voltages. Accordingly, this detector can have high detection sensitivity over a wide range of accelerating voltages.

(2) In one feature of this detector, the second light emission portion transmits the light produced by the first light emission portion. The light detector may detect the light which is transmitted through the second light emission portion after being produced by the first light emission portion.

This detector can provide high detection sensitivity, for example, to a charged particle beam accelerated by a low voltage.

(3) In another feature of this detector, the first light emission portion may have a thickness between 5 μm and 500 μm, inclusively.

(4) In a further feature of this detector, there may be further provided an electrically conductive film with which the first light emission portion is coated.

In this detector, charge up of the first light emission portion can be prevented.

(5) A charged particle beam instrument associated with the present invention includes a detector associated with the present invention.

This charged particle beam instrument includes the detector associated with the present invention and, therefore, good images can be obtained over a wide range of accelerating voltages.

DESCRIPTION OF THE INVENTION

The preferred embodiments of the present invention are hereinafter described in detail with reference to the drawings. It is to be understood that the embodiments provided below do not unduly restrict the scope of the present invention delineated by the appended claims and that not all the configurations described below are essential constituent components of the invention.

1. First Embodiment

1.1. Detector

Figure 1:
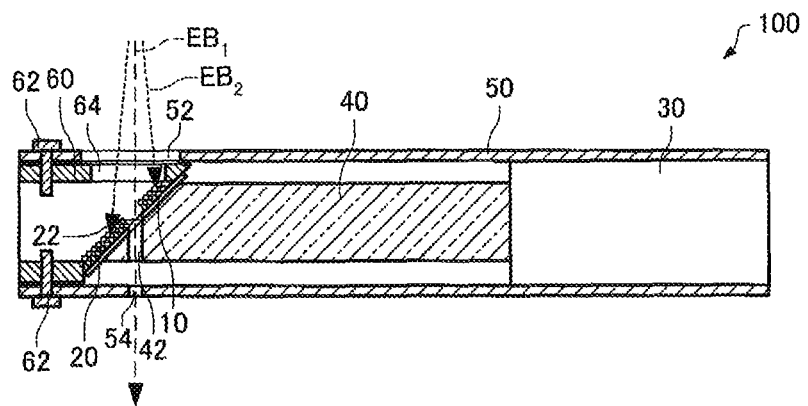
FIG. 1 is a schematic cross section of a detector associated with a first embodiment of the present invention.

A detector associated with a first embodiment of the present invention is first described by referring to FIG. 1, which is a schematic cross section of the detector 100.

The detector 100 is used to detect a charged particle beam which is a beam of electrons, ions, or other charged particles. In the present embodiment, the detector 100 is a dark-field detector for use in scanning transmission electron microscopy (STEM). In particular, the detector 100 detects backscattered electrons $EB_2$ emanating from a sample when it is irradiated with an electron beam, and passes electrons $EB_1$ transmitted through the sample as shown in FIG. 1.

As shown in FIG. 1, the detector 100 is configured including a first light emission portion 10, a second light emission portion 20, a light detector 30, a light guide 40, a cylindrical body 50, and a cap 60.

Figure 2:
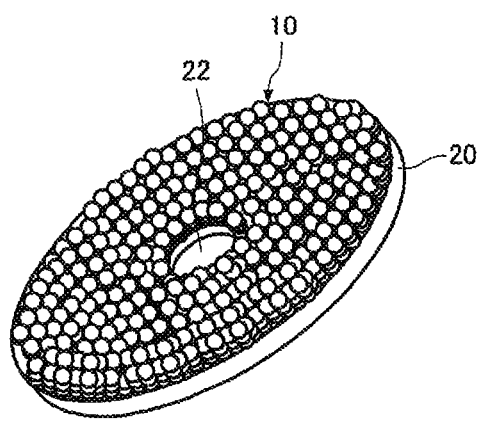
FIG. 2 is a schematic perspective view of the first and second light emission portions of the detector shown in FIG. 1.
Figure 3:
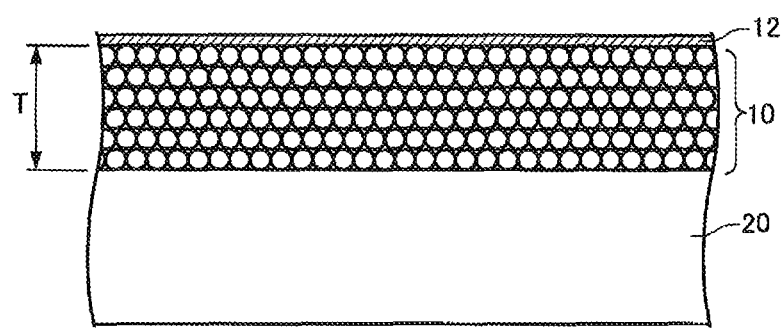
FIG. 3 is a schematic cross section of the first and second light emission portions of the detector shown in FIG. 2.

FIG. 2 is a schematic perspective view of the first light emission portion 10 and the second light emission portion 20. FIG. 3 is a schematic cross section of the first light emission portion 10 and the second light emission portion 20. In FIGS. 1 and 2, a conductive film 12 (see FIG. 3) is omitted from being shown for the sake of convenience.

The first light emission portion 10 converts the backscattered electrons $EB_2$ into light, and is mounted on the second light emission portion 20.

The first light emission portion 10 is a powdered scintillator. That is, the first light emission portion 10 is composed of multiple scintillator particles. Furthermore, the first light emission portion 10 may contain a binder (not shown). The scintillator particles have diameters, for example, between 2 μm and 10 μm, inclusively. The first light emission portion 10 has a thickness T (see FIG. 3), for example, between 5 μm and 500 μm, inclusively.

The first light emission portion 10 is made of P22 (ZnS: Cu), P43 ($Gd_2O_2S$:Tb), P46 ($Y_3Al_5O_{12}$:Ce), P47 ($Y_2SiO_5$: Ce), powdered LSO:Ce ($Lu_2SiO_5$:Ce), or other material.

As shown in FIG. 3, the surface of the first light emission portion 10 is coated with the electrically conductive film 12 to prevent charge up of the first light emission portion 10. The conductive film 12 is made of aluminum, carbon, or other material.

The second light emission portion 20 converts the backscattered electrons $EB_2$, which are transmitted through the first light emission portion 10 without being converted into light, into light. The second light emission portion 20 is mounted on the light guide 40. In particular, the second light emission portion 20 is mounted on one end surface of the light guide 40. The second light emission portion 20 is disposed at a given angle (e.g., 45 degrees) with respect to the direction of travel of the electrons $EB_1$ transmitted through the sample without being scattered.

The second light emission portion 20 is a single crystal scintillator which is made of YAP:Ce (Yttrium aluminum pervoskite), YAG:Ce (Yttrium aluminum garnet), LSO:Ce ($Lu_2SiO_5$:Ce), or other material. The second light emission portion 20 may be identical to or different in material from the first light emission portion 10. The material of the second light emission portion 20 is transparent to the light generated in the first light emission portion 10. That is, the material of the second light emission portion 20 has high transmittance for the light. No restriction is placed on the thickness of the second light emission portion 20, and the thickness is between 5 μm and 500 μm, inclusively, for example.

The first light emission portion 10 and the second light emission portion 20 are formed annularly. Each of these emission portions 10 and 20 is provided with a through-hole 22 that is in communication with a through-hole 42 formed in the light guide 40. The through-hole 22 permits passage of the electrons $EB_1$ transmitted through the sample without being scattered.

The light detector 30 detects the light generated by the first light emission portion 10 and the light generated by the second light emission portion 20. The light detector 30 is connected to the end surface of the light guide 40 that faces away from the end surface on which the second light emission portion 20 is mounted. The light detector 30 detects the light incident via the light guide 40 after being generated by the first light emission portion 10 and the light generated by the second light emission portion 20. For example, the light detector 30 is a photomultiplier tube (PMT) which amplifies light energy and converts it into electrical energy by making use of the photoelectric effect.

The light guide 40 is used to guide the light generated by the first light emission portion 10 and the light generated by the second light emission portion 20 to the light detector 30. The light guide 40 is shaped, for example, in a pillarlike form. In the illustrated example, the light guide 40 has a shape obtained by cutting one end of a circular cylinder at a given angle (e.g., 45 degrees) with respect to the central axis of the cylinder. Alternatively, the light guide 40 may be shaped in a circular cylinder (not shown).

The light guide 40 is made of glass, acrylic resin, or other material. The light guide 40 may be fabricated by depositing a film of a metal (such as aluminum) onto the side surface of a circular cylinder of glass. Alternatively, the light guide 40 may be fabricated by binding together plural optical fibers (not shown). The light guide 40 is provided with the through-hole 42 for permitting passage of the transmitted electrons $EB_1$. The through-hole 42 is in communication with the through-hole 22 that is formed in the first and second light emission portions 10, 20.

The cylindrical body 50 is a member for accommodating the first light emission portion 10, second light emission portion 20, light detector 30, and light guide 40. The cylindrical body 50 has a window 52 for permitting passage of the electrons $EB_1$ and $EB_2$. Furthermore, the cylindrical body 50 has another window 54 for permitting passage of the electrons $EB_1$ passed through the through-holes 22, 42. The cylindrical body 50 has electrical conductivity, and is made of a metal such as aluminum.

Figure 4:
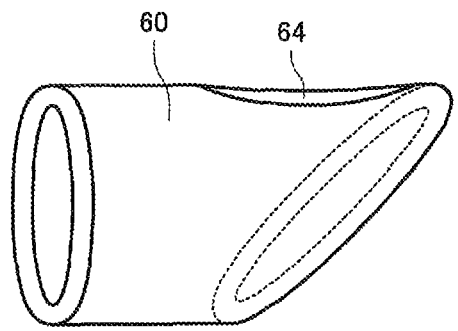
FIG. 4 is a schematic perspective view of the cap of the detector shown in FIG. 1.

The cap 60 is a member for holding the first light emission portion 10 and the second light emission portion 20. FIG. 4 is a schematic perspective view of the cap 60. The cap 60 has a shape obtained by cutting one end of a circular cylinder at a given angle (e.g., 45 degrees) with respect to the central axis of the cylinder. In the example shown in FIG. 1, one end surface of the cap 60 is in contact with the second light emission portion 20. The cap 60 is provided with a through-hole 64 for permitting passage of the electrons $EB_1$ and $EB_2$.

In the detector 100, the first light emission portion 10 and the second light emission portion 20 are captively held between the cap 60 and light guide 40. In the illustrated example, the second light emission portion 20 is sandwiched and held between the cap 60 and the light guide 40. The cap 60 is held to the cylindrical body 50 with pins or screws 62. The cap 60 is made of a conductive material such as aluminum, thus preventing charge up of the first light emission portion 10 and the second light emission portion 20.

The luminance characteristics of the first light emission portion 10 and the second light emission portion 20 with respect to accelerating voltage are next described. The accelerating voltage is used to produce an electric field that accelerates a beam of charged particles (i.e., the backscattered electrons $EB_2$) to be detected by the detector 100. For example, an accelerating voltage is applied between the cathode and anode of an electron gun within a transmission electron microscope. The luminance referred to herein is the luminance of light converted from the beam of charged particles (backscattered electrons $EB_2$) in the first light emission portion 10 and second light emission portion 20.

Figure 5:
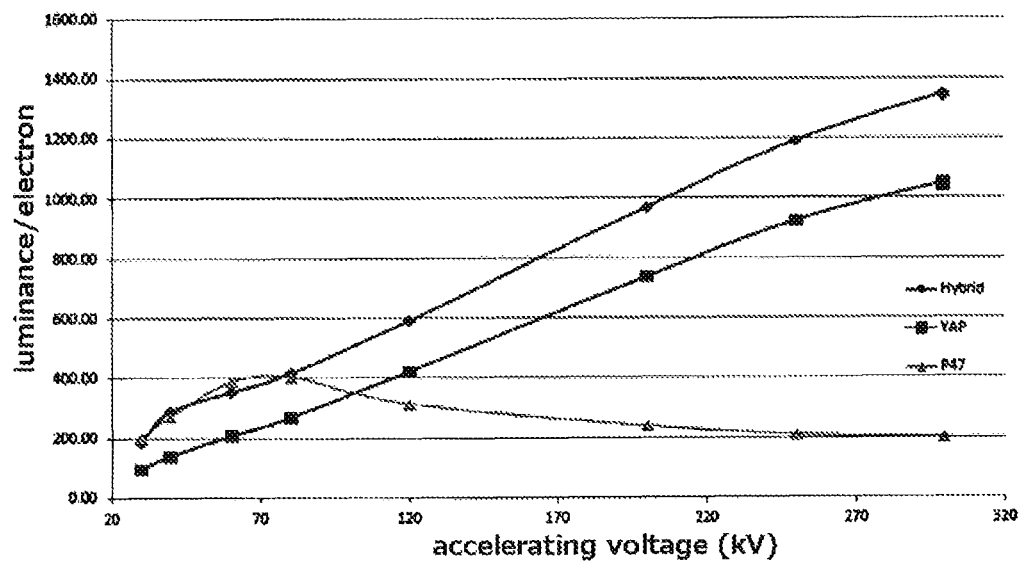
FIG. 5 is a graph showing the luminance characteristics of scintillators relative to accelerating voltage.

FIG. 5 is a graph showing the luminance characteristics of scintillators relative to accelerating voltage. In this graph, accelerating voltage (in kV) is plotted on the horizontal axis. Luminance obtained when a single electron is converted into light by each scintillator is plotted on the vertical axis. "Hybrid" shown in the graph of FIG. 5 indicates a curve showing characteristics obtained when the first light emission portion 10 is made of P47 and the second light emission portion 20 is made of YAP. As comparative examples, the characteristics of a powdered scintillator made of P47 and the characteristics of a single crystal scintillator made of YAP are shown. The powdered scintillator of P47 has a film thickness of 30 μm, while the single crystal scintillator of YAP has a film thickness of 500 μm. In the hybrid sample, the scintillator of P47 has a film thickness of 20 μm and the scintillator of YAP has a film thickness of 500 μm.

As shown in FIG. 5, as the accelerating voltage is increased, the luminance of the single crystal scintillator of YAP increases. The characteristic curve of the powdered scintillator of P47 has a peak at a certain accelerating voltage (near 80 kV in the illustrated example).

The differences in characteristics between the single crystal scintillator and the powdered scintillator arise from the fact that the single crystal scintillator is transparent to light, while the powdered scintillator is not transparent to light. The value of the accelerating voltage at which the luminance of the powdered scintillator shows its peak varies depending on the thickness of the scintillator.

In contrast, the hybrid sample shows high luminance over a wide range from a low voltage of 30 kV to a high value of 300 kV compared with the single crystal scintillator of YAP and powdered scintillator of P47 as shown in FIG. 5, for the following reason. The electron beam accelerated by low voltages are converted into light mainly by the first light emission portion 10 consisting of the powdered scintillator. The electron beam accelerated by high voltages passes through the first light emission portion 10 and is converted into light principally by the second light emission portion 20.

The detector 100 associated with the first embodiment has the following features.

The detector 100 has the first light emission portion 10 for converting the backscattered electrons $EB_2$ into light, the second light emission portion 20 for converting the backscattered electrons $EB_2$ transmitted through the first light emission portion 10 into light, and the light detector 30 for detecting the light generated by the first light emission portion 10 and the light generated by the second light emission portion 20. The first light emission portion 10 is a powdered scintillator. The second light emission portion 20 is a single crystal scintillator. Consequently, the luminance of the light produced by converting the backscattered electrons $EB_2$ can be enhanced over a wide range of accelerating voltages as described previously. Thus, the detector 100 can have high detection sensitivity over a wide range from a low accelerating voltage to a high accelerating voltage.

In the detector 100, the second light emission portion 20 transmits the light generated by the first light emission portion 10. The light detector 30 detects the light which is transmitted through the second light emission portion 20 after being generated by the first light emission portion 10. In consequence, the detector can provide high detection sensitivity to the backscattered electrons $EB_2$ accelerated by low voltages.

The detector 100 includes the conductive film 12 that covers the first light emission portion 10. As a result, it is possible to prevent charge up of the first light emission portion 10.

In the detector 100, the first light emission portion 10 and second light emission portion 20 are sandwiched and held between the cap 60 and the light guide 40. Therefore, the first light emission portion 10 and second light emission portion 20 can be easily attached to and detached from the detector 100. Consequently, the first light emission portion 10 and second light emission portion 20 can be readily exchanged.

1.2. Method of Fabricating Detector

Figure 6:
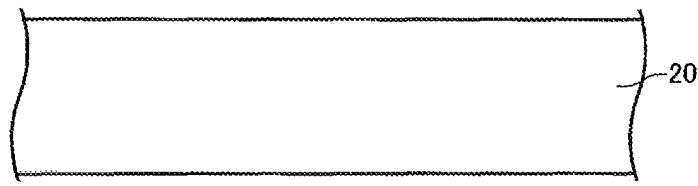
FIGS. 6 and 7 are schematic cross sections of the detector shown in FIG. 1, illustrating a method of fabricating the detector.
Figure 7:
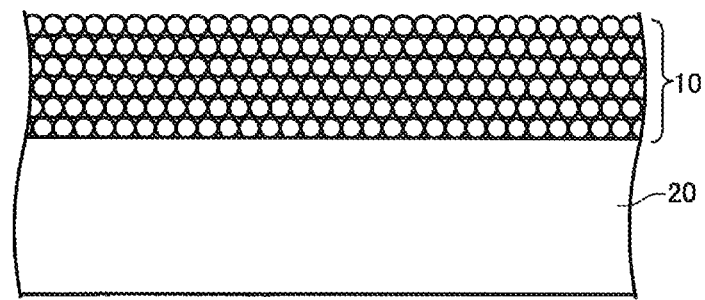

A method of fabricating the detector 100 associated with the first embodiment is next described by referring to FIGS. 6 and 7, which are schematic cross sections of the detector 100.

As shown in FIG. 6, the second light emission portion 20 is prepared. The second light emission portion 20 is made of a single crystal of YAP, YAG, or LSO.

As shown in FIG. 7, scintillator particles are deposited on the second light emission portion 20 to form the first light emission portion 10.

The method of forming the first light emission portion 10 can be modified as follows. The second light emission portion 20 is first submerged in a liquid. Then, scintillator particles are sprinkled over the liquid. Then, the second light emission portion 20 is made to catch up the scintillator particles. Thereafter, the liquid is dried off. Consequently, the first light emission portion 10 can be formed on the second light emission portion 20.

As shown in FIG. 3, the conductive film 12 is formed on the first light emission portion 10, for example, by sputtering.

As shown in FIG. 1, the light detector 30 and the light guide 40 are received in the cylindrical body 50. The second light emission portion 20 and the first light emission portion 10 are then arranged on one end surface of the light guide 40. The cap 60 is inserted into the cylindrical body 50. The second light emission portion 20 and the first light emission portion 10 are inserted between the cap 60 and light guide 40 such that the emission portions 20, 10 are sandwiched and held between the cap 60 and light guide 40 and that the through-hole 42 in the light guide 40 and the through-hole 22 in the first and second light emission portions 10, 20 are placed in communication with each other.

Because of the processing steps described so far, the detector 100 can be fabricated.

2. Second Embodiment

Figure 8:
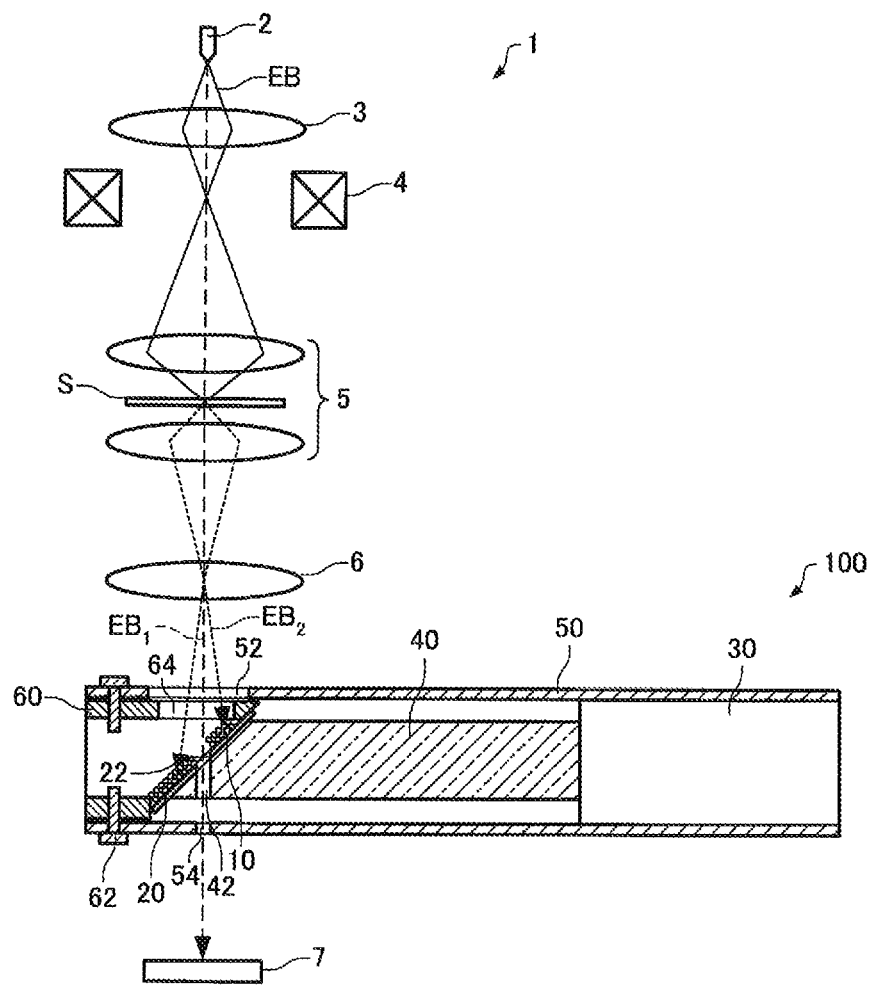
FIG. 8 is a schematic cross section of a charged particle beam instrument associated with a second embodiment of the invention.

A charged particle beam instrument, 1, associated with a second embodiment of the present invention is next described by referring to FIG. 8, which shows the configuration of the instrument 1. In this example, the charged particle beam instrument 1 is a scanning transmission electron microscope (STEM).

As shown in FIG. 8, the charged particle beam instrument 1 is configured including the detector associated with the present invention. In this example, the instrument 1 is configured including a dark-field detector 100 as a detector associated with the present invention.

Furthermore, the charged particle beam instrument 1 includes an electron beam source 2, condenser lenses 3, scan coils 4, an objective lens assembly 5, a projector lens 6, and a bright-field detector 7.

The electron beam source 2 produces an electron beam EB by accelerating electrons released from a cathode by means of an anode. No restriction is imposed on the accelerating voltage for accelerating the electrons. For example, the accelerating voltage is between 30 kV and 300 kV, inclusively. A well-known electron gun, such as a thermionic electron gun, thermal field emission electron gun, or cold field emission gun, can be used as the electron beam source 2.

The condenser lenses 3 are disposed behind (downstream along the electron beam EB) the electron beam source 2. The condenser lenses 3 are used to focus the electron beam EB generated by the electron beam source 2. The condenser lenses 3 may be arranged in plural stages (not shown).

The scan coils 4 are disposed behind the condenser lenses 3. The scan coils 4 scan the electron beam EB (i.e., an electron probe) focused by the condenser lenses 3 and objective lens assembly 5 over a sample S.

The objective lens assembly 5 is disposed behind the scan coils 4. The objective lens assembly 5 is used to focus the electron beam EB such that the beam hits the sample S.

The sample S is supported by a sample holder (not shown). The sample S is placed in position within the sample chamber by the sample stage. The sample stage can horizontally move, vertically move, rotate, and tilt the sample S, for example.

The projector lens 6 is disposed behind the objective lens assembly 5, and is used to project an image plane or back focal plane (diffraction plane) of the objective lens assembly 5 onto the detector 100 or onto the bright-field detector 7.

The detector 100 is located behind the projector lens 6. In the illustrated example, the detector 100 operates as a dark-field detector. The detector 100 detects the electrons $EB_2$ backscattered in the sample S. The electrons $EB_1$ transmitted through the sample S without being scattered pass through the through-holes 22 and 42 and through the window 54.

The bright-field detector 7 is disposed behind the detector 100. The bright-field detector 7 detects the electrons $EB_1$ transmitted through the detector 100. The bright-field detector 7 is configured, for example, including a scintillator and a photomultiplier tube.

The operation of the charged particle beam instrument 1 is next described.

In the charged particle beam instrument 1, an accelerating voltage is applied between the cathode and anode of the electron gun in the electron beam source 2, thus accelerating the electrons of the electron beam EB. This beam is focused by the condenser lenses 3 and objective lens assembly 5 and directed at the sample S. At this time, the sharply focused electron beam EB is scanned over the sample S using the scan coils 4.

When the electron beam EB hits the sample S, the electrons $EB_2$ backscattered by the sample S and electrons $EB_1$ transmitted through the sample S without being scattered enter the window 52 of the cylindrical body 50 of the detector 100 via the projector lens 6.

The backscattered electrons $EB_2$ entering the window 52 pass through the through-hole 64 in the cap 60 and enter the first light emission portion 10.

In the charged particle beam instrument 1, when the accelerating voltage is low, the electrons EB2 are converted into light mainly by the first light emission portion 10. The produced light passes through the second light emission portion 20 and is detected by the light detector 30 via the light guide 40.

Furthermore, in the charged particle beam instrument 1, when the accelerating voltage is high, the backscattered electrons $EB_2$ pass through the first light emission portion 10 and are converted into light mainly by the second light emission portion 20. The produced light is detected by the light detector 30 via the light guide 40.

The light detector 30 amplifies the incident light, converts it into electrical energy, and outputs it as an electrical signal. In the charged particle beam instrument 1, a dark field image is created while synchronizing the electrical signal with a scan signal supplied to the scan coils 4.

On the other hand, the transmitted electrons $EB_1$ entering the window 52 pass through the detector 100. In particular, the transmitted electrons $EB_1$ pass through the window 52 of the cylindrical body 50, the through-hole 64 in the cap 60, the through-hole 22 in the light emission portions 10, 20, the through-hole 42 in the light guide 40, and the window 54 in the cylindrical body 50. The transmitted electrons $EB_1$ passed through the detector 100 are detected by the bright-field detector 7.

The charged particle beam instrument 1 creates a bright field image, based on the output signal from the bright-field detector 7.

The charged particle beam instrument 1 is configured including the detector 100. Thus, the instrument can provide high detection sensitivity over a wide range of accelerating voltages. Accordingly, the charged particle beam instrument 1 can perform dark field imaging over a wide range of accelerating voltages.

3. Third Embodiment

Figure 9:
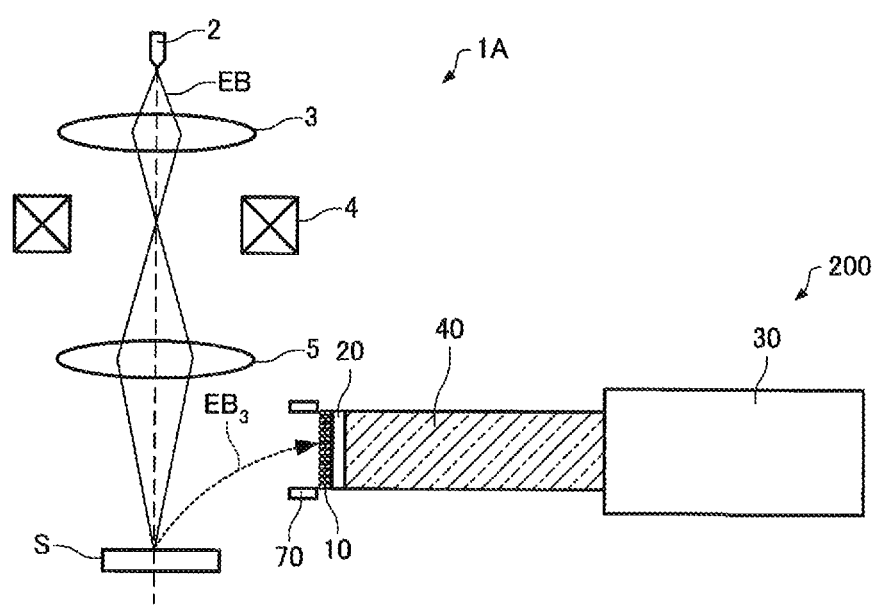
FIG. 9 is a schematic cross section of a charged particle beam instrument associated with a third embodiment of the invention.

A charged particle beam instrument 1A, associated with a third embodiment of the present invention, is next described by referring to FIG. 9, which shows the configuration of the instrument 1A. In this example, the charged particle beam instrument 1A is a scanning electron microscope (SEM).

In the following description, those components of the charged particle beam instrument 1A associated with the third embodiment which are similar in function with their respective counterparts of the detector 100 associated with the first embodiment and the charged particle beam instrument 1 associated with the second embodiment are indicated by the same references as in the above-referenced figures and a description thereof is omitted.

As shown in FIG. 9, the charged particle beam instrument 1A is configured including the detector associated with the present invention. It is now assumed that the instrument 1A includes a detector 200 associated with the present invention. The detector 200 operates as a secondary electron detector in the instrument 1A.

Furthermore, the charged particle beam instrument 1A includes an electron beam source 2, condenser lenses 3, scan coils 4, and an objective lens assembly 5.

The detector 200 is configured including a first light emission portion 10, a second light emission portion 20, a light detector 30, a light guide 40, and a collector 70.

The collector 70 is disposed on the upstream side of the first light emission portion 10 as viewed along the stream of secondary electrons $EB_3$. An accelerating voltage, for example, of ± hundreds of volts is applied to the collector 70. As a result, secondary electrons $EB_3$ released from the sample S are accelerated and enter the first light emission portion 10. The detection efficiency of the detector 200 can be varied by adjusting the applied accelerating voltage.

The first light emission portion 10 and second light emission portion 20 are similar in configuration with the above-described first light emission portion 10 and second light emission portion 20 of the detector 100 shown in FIG. 3 except that the first light emission portion 10 and second light emission portion 20 of FIG. 9 are not provided with the through-hole 22. Furthermore, the light guide 40 is similar in configuration with the light guide 40 of the detector 100 shown in FIG. 1 except that the light guide 40 of FIG. 9 is not provided with the through-hole 42.

The operation of the charged particle beam instrument 1A is next described.

In the charged particle beam instrument 1A, the electron beam EB released from the electron beam source 2 is focused onto the sample S by the condenser lenses 3 and objective lens assembly 5. At this time, the sharply focused electron beam EB is scanned over the sample S using the scan coils 4.

The secondary electrons $EB_3$ are released from the sample S in response to impingement by the electron beam EB. The released secondary electrons $EB_3$ are accelerated by the collector 70 having a given accelerating voltage applied thereto and enter the detector 200. This detector 200 detects the secondary electrons $EB_3$.

In the charged particle beam instrument 1A, if the accelerating voltage for accelerating the secondary electrons $EB_3$ is low, the incident secondary electrons $EB_3$ are converted into light mainly by the first light emission portion 10. The produced light passes through the second light emission portion 20 and is detected by the light detector 30 via the light guide 40.

In the charged particle beam instrument 1A, when the accelerating voltage is high, the incident secondary electrons $EB_3$ pass through the first light emission portion 10 and are converted into light mainly by the second light emission portion 20. The produced light is detected by the light detector 30 via the light guide 40.

The light detector 30 amplifies the incident light into electrical energy and outputs it as an electrical signal. In the charged particle beam instrument 1A, this electrical signal is synchronized with the scan signal for the scan coils 4 and imaged. That is, a secondary electron image is created.

The charged particle beam instrument 1A is configured including the detector 200. Consequently, the instrument can provide wide detection sensitivity over a wide range of accelerating voltages from a low accelerating voltage to a high accelerating voltage. Hence, the charged particle beam instrument 1A can obtain good secondary electron images over a wide range of accelerating voltages from a low accelerating voltage to a high accelerating voltage.

The present invention embraces configurations (e.g., configurations identical in function, method, and results or identical in purpose and advantageous effects) which are substantially identical to the configurations described in connection with the above embodiments. Furthermore, the invention embraces configurations which are similar to the configurations described in connection with the above embodiments except that their nonessential portions have been replaced. Additionally, the invention embraces configurations which are identical in advantageous effects to, or which can achieve the same object as, the configurations described in connection with the above embodiments. Further, the invention embraces configurations which are similar to the configurations described in connection with the above embodiments except that a well-known technique is added.

Having thus described my invention with the detail and particularity required by the Patent Laws, what is desired protected by Letters Patent is set forth in the following claims.

The invention claimed is:

1. A detector for detecting a charged particle beam, said detector comprising:
    a first light emission portion for converting the charged particle beam into light;
    a second light emission portion for converting the charged particle beam transmitted through the first light emission portion into light; and
    a light detector for detecting the light produced by the first light emission portion and the light produced by the second light emission portion,
    wherein said first light emission portion is a powdered scintillator and said second light emission portion is a single crystal scintillator.

2. The detector as set forth in claim 1, wherein said second light emission portion transmits the light produced by said first light emission portion, and wherein said light detector detects the light which is transmitted through the said second light emission portion after being produced by the first light emission portion.

3. The detector as set forth in claim 2, wherein said first light emission portion has a thickness between 5 µm and 500 µm, inclusively.

4. The detector as set forth in claim 3, further comprising a conductive film with which said first light emission portion is coated.

5. The charged particle beam instrument including a detector as set forth in claim 4.

* * * * *